United States Patent [19]
Jung et al.

[11] Patent Number: 6,045,967
[45] Date of Patent: Apr. 4, 2000

[54] METHOD AND DEVICE USING ARF PHOTORESIST

[75] Inventors: Jae Chang Jung; Chi Hyeong Roh; Joo On Park, all of Kyoungki-do, Rep. of Korea

[73] Assignee: Hyundai Electronics Industries Co., Ltd., Rep. of Korea

[21] Appl. No.: 09/003,780

[22] Filed: Jan. 7, 1998

[30] Foreign Application Priority Data

Jan. 10, 1997 [KR] Rep. of Korea .......................... 97-472

[51] Int. Cl.$^7$ ................................ G03C 1/72; G03C 1/74
[52] U.S. Cl. ...................... 430/270.1; 522/151; 522/153; 522/154; 522/113
[58] Field of Search ..................... 522/151, 153, 522/154, 113; 526/310, 318, 318.3, 330; 430/270.1

[56] References Cited

U.S. PATENT DOCUMENTS

| | | |
|---|---|---|
| 3,370,047 | 2/1968 | Raines . |
| 4,011,386 | 3/1977 | Matsumoto et al. ..................... 526/259 |
| 4,106,943 | 8/1978 | Ikeda et al. ........................... 430/288.1 |
| 4,491,628 | 1/1985 | Ito et al. ................................. 430/176 |
| 4,883,740 | 11/1989 | Schwalm et al. ....................... 430/270 |
| 5,087,677 | 2/1992 | Brekner et al. .......................... 526/160 |
| 5,212,043 | 5/1993 | Yamamoto et al. ..................... 430/192 |
| 5,252,427 | 10/1993 | Bauer et al. ............................ 430/270 |
| 5,278,214 | 1/1994 | Moriya et al. ........................... 524/238 |
| 5,585,219 | 12/1996 | Kaimoto et al. ..................... 430/270.1 |
| 5,866,665 | 2/1999 | Shaffer et al. ........................ 526/348.4 |

FOREIGN PATENT DOCUMENTS

| | | |
|---|---|---|
| 0 789 278 A2 | 2/1997 | European Pat. Off. . |
| 794458 | 9/1997 | European Pat. Off. . |
| 0836119A1 | 11/1997 | European Pat. Off. . |
| 04099967 | 2/1992 | Japan . |
| 128164 | 2/1977 | Netherlands . |
| 1329997 | 9/1970 | United Kingdom . |
| 1335095 | 10/1973 | United Kingdom . |
| WO 96/37526 | 11/1996 | WIPO . |
| WO 97/33198 | 9/1997 | WIPO . |

OTHER PUBLICATIONS

T.I. Wallow et al., "Evaluation of Cyclo–Olefin–Maleic Anhydride Alternating Copolymers as Single–Layer Photo–Resists for 193 NM Photo–Lithography" SPIE vol. 2724/354–365.

Thomas I Wallow, et al., "Evaluation of Cycloolefin–Maleic Anhydride Alternating Copolymers as Single–Layer Photoresist for 193nm Photolithography", 1996, Proc. SPIE, vol. 2724, 355–364.

R.D. Allen et. al., "The Influence of Photoacid Structure on the Design and Performance of 193nm Resists", 1997, Journal of Photopolymer Science and Technology, vol. 10, 503–510.

F.M. Houlihan et. al., "A Commercially Viable 193nm Single Layer Resist Platform", 1997, Journal of Photopolymer Science and Technology, vol. 10, 511–520.

J.C. Jung et. al., "ArF Single Layer Resist Composed of Alicyclic Main Chain Containing Maleic Anhydride", 1997, Journal of Photopolymer Science and Technology, vol. 10, 529–533.

S.J. Choi et. al., "New ArF Single–layer Resist for 193–nm Lithography", 1997, Journal of Photopolymer Science and Technology, vol. 10, 521–528.

K. Nozaki and Ei Yaro, "New Protective Groups in Methacrylate Polymer for 193–nm Resists", 1997, Journal of Photopolymer Science and Technology, vol. 10, 545–550.

(List continued on next page.)

*Primary Examiner*—John S. Chu
*Assistant Examiner*—Sin J. Lee
*Attorney, Agent, or Firm*—Townsend and Townsend and Crew LLP

[57] ABSTRACT

A novel photoresist copolymer, consisting of at least two aliphatic cyclo-olefins and an amine, which is useful for the photolithography using ArF as a light source. The photoresist prepared from the copolymer can be patterned with high resolution.

20 Claims, 2 Drawing Sheets-

OTHER PUBLICATIONS

K. Nakano et. al., "Chemically Amplified Resist Based on High Etch–Resistant Polymer for 193–nm Lithography", 1997, Journal of Photopolymer Science and Technology, vol. 10, 561–569.

CA Abstract 127;227308 & Proc. SPIE–Int. Soc. Opt. Eng. (1997) 3049 Advances in Resist Technology and Processing XIV 92–103.

CA Abstract 127;227269 & J. Photopolym. Sci. Technol. (1997) 10(4) 529–534.

CA Abstract 66;18889 & Magy. Kem. Foly. (1966) 72(11)491–3.

CA Register No. 100207–98–5.

CA Register No. 32759–57–2.

CA Register No. 27056–70–8.

CA Register No. 174659–58–6.

CA Register No. 28503–41–5.

CA Register No. 194997–59–6.

CA Abstract No. 104:149512 & Macromolecules 19(4) 1266–8 (1986).

CA Abstract No. 91:124064 & Makromol. Chem. 180(8) 1975–88 (1979).

CA Abstract No. 113:24734 & JP 02 051511.

CA Abstract No. 124:317926 & Marcomol. Rapid Commun. 17(3) 173–180 (1996).

CA Abstract No. 124:203171 & Macromolecules 29(8) 2755–63 (1996).

CA Registry No. 199328–07–9.

METHOD AND DEVICE USING ARF PHOTORESIST

BACKGROUND OF THE INVENTION

The present invention relates to a technique for manufacturing electronic or semiconductor devices. More particularly, the present invention provides a novel photolithography technique using, for example, an ArF light source (i.e., 193 nm), and a novel amine-introduced photoresist resin, which is suitable for photolithography using the ArF light source, but is not limited to this light source. In exemplary embodiments, the present invention provides techniques for using the novel photoresist resin in a lithography process for the manufacture of semiconductor integrated circuits or the like.

In the manufacture of highly integrated semiconductor devices, precisely controlled formation of structures is often required to form tiny regions, which form elements of electronic devices on a slice of silicon material. These regions are often created by way of a photolithography process. Photolithography often uses steps of spin coating a thin layer of photoresist material onto a surface of the slice of silicon or film on the silicon to be patterned. The thin layer of photoresist material is often selectively exposed using radiation such as ultraviolet light, electrons, or x-rays. An exposure tool such as a mask using a "stepper" selectively exposes the thin layer of photoresist material. The exposed regions of the thin layer are often developed by way of a chemical process. After development, the thin layer overlying the slice of silicon includes exposed regions which remain for subsequent processing. The subsequent processing step such as etching imprints the pattern made by the exposed region into the slice of silicon or film on the silicon.

Conventional optical photoresists are often three-component materials. These materials include a matrix material, commonly called the resin, which serves as a binder, and establishes the mechanical properties of the film. Additionally, the photoresist includes a sensitizer, commonly termed the inhibitor, which is a photoactive compound ("PAC"), and a solvent, which suspends the resist in a liquid state until it is applied to the substrate being processed. The resin is often inert to the incident imaging radiation and often does not undergo chemical change upon radiation, but provides the resist film with properties such as adhesion and etch resistance. Additionally, the resin provides other film properties such as resist thickness, flexibility, and thermal flow stability.

One example of a resin material is a conventional poly(acrylate) resin. The polyacrylate resin is often relatively easy to synthesize. For example, conventional polymerization techniques are often used to form this type of resin in many applications. Unfortunately, these resins have poor etch resistance and development characteristics. In some cases, etch resistance can be improved by introducing aliphatic ring moieties to the poly(acrylate) main polymer chain. Even in these cases, however, there still remain numerous other limitations. For example, development of conventional polyacrylate resin often produces a "roundish" upper resist edge, as shown in FIG. 1, for instance. Accordingly, the polyacrylate resin often cannot provide high resolution photoresist patterns but lower resolution patterns. These lower resolutions patterns simply cannot create accurate features for the manufacture of the highly integrated semiconductor devices.

From the above, it is seen that an improved photoresist product for producing high resolution patterns is highly desirable.

SUMMARY OF THE INVENTION

The present invention relates to a technique for manufacturing electronic or semiconductor devices. In an exemplary embodiment, the present invention provides a novel photolithography technique using an ArF light source (i.e., 193 nm), and a novel amine-introduced photoresist resin, which is suitable for photolithography using the ArF light source. In additional embodiments, the present invention provides techniques for using the novel photoresist resin in a lithography process in the manufacture of semiconductor integrated circuits or the like.

In a specific embodiment, the present invention provides a method for preparing the novel photoresist copolymer. Among others, the copolymer includes at least two aliphatic cyclo-olefins and an amine. The copolymer is prepared generally at a temperature ranging from about 60 to about 200 degrees C., but can also be at other temperatures. The pressure maintained during preparation ranges from about 200 to about 500 atm, but can be others.

In an alternative embodiment, the present invention provides a photoresist comprising the novel photoresist copolymer. Among others, the copolymer includes at least two aliphatic cyclo-olefins and an amine. The copolymer is prepared generally at a temperature ranging from about 60 to about 200 degrees C., but can also be at other temperatures. The pressure maintained during preparation ranges from about 200 to about 500 atm, but can be others.

In yet another embodiment, the present invention provides a photoresist copolymer, comprising at least two aliphatic cyclo-olefins and an amine. The copolymer is prepared generally at a temperature ranging from about 60 to about 200 degrees C., but can also be at other temperatures. The pressure maintained during preparation ranges from about 200 to about 500 atm, but can be others.

Numerous benefits are achieved by way of the present invention. In particular, the present invention provides a novel photoresist copolymer, which is superior in etch resistance, thermal resistance, and adhesiveness. In addition, it allows the resulting pattern to have a substantially rectangular upper part, rather than the rounded one commonly found in conventional photoresist resins. Photoresist stability also improves. In other embodiments, the present invention achieves improved results by way of an amine moiety. In these embodiments, photoresist pattern resolution is improved, PED stability is increased, and a rectangular photoresist profile is achieved. The present invention provides a photoresist pattern, which is generally not influenced with development time or the like, such as conventional techniques, which rely upon a maleic anhydride for polymerizing an alicyclic olefin. These and other benefits are found in some, if not all, of the embodiments described herein and others.

The above and other benefits and aspects of the invention will become apparent from the following description of embodiments with reference to the accompanying drawings.

DETAILED DESCRIPTION OF THE INVENTION

Figure 1:
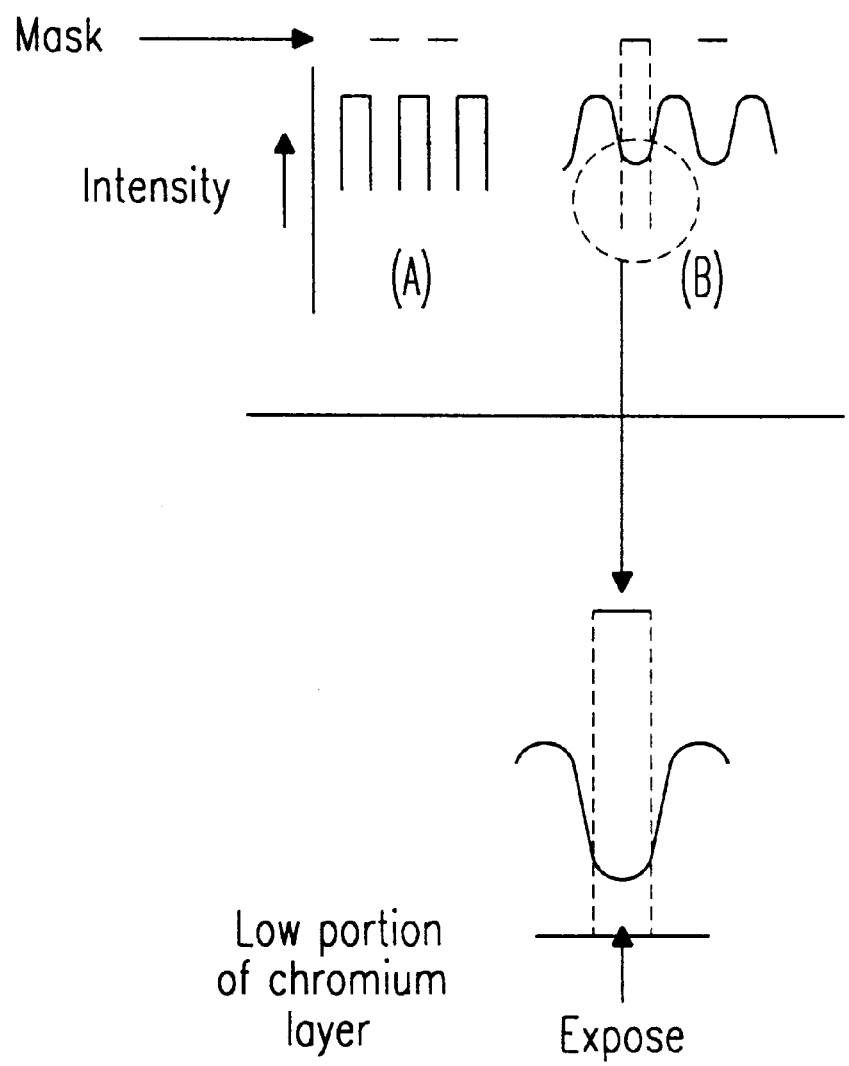
FIG. 1 shows an ideal pattern image profile (A) and a conventional pattern image profile (B) formed by exposure of light in accordance with a conventional technique.

In an exemplary embodiment, the present invention provides a novel photoresist resin, which can be used with, for example, an ArF light source (i.e., 193 nm). The present invention also provides a novel amine-introduced photoresist resin, which is suitable for photolithography using the ArF as a light source. Additionally, the present invention provides techniques for using the novel photoresist resin in a lithography process.

In a specific embodiment, the present invention pertains to a novel photoresist copolymer comprising at least two aliphatic cyclo-olefins and an amine. Preferred examples of the aliphatic cyclo-olefins include vinylene carbonate, 2-cyclopentene-1-acetic acid, 2-cyclopentene-1-(t-butyl acetate), t-butyl bicyclo[2,2,2]oct-5-ene-2-carboxylate, bicyclo[2,2,2]oct-5-ene-2-carboxylic acid, 2-hydroxyethylbicyclo[2,2,2]oct-5-ene 2-carboxylate, 2-hydroxyethyl 5-norbonene-2-carboxylate t-butyl 5-norbonene-2-carboxylate, 5-norbonene-2-carboxylic acid, cyclopentene, cyclohexene, norbonylene, and norbonylene-2-methanol, and others. As merely examples, structures are shown in the following chemical formulas I:

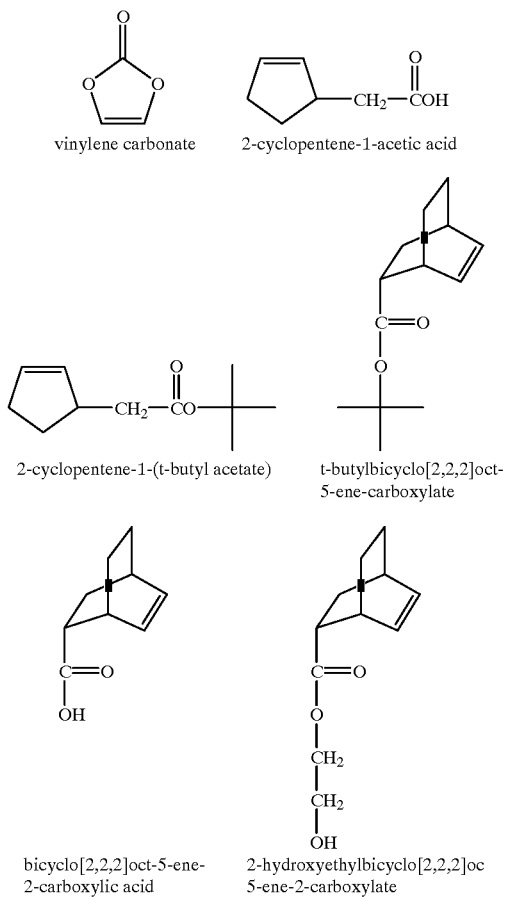

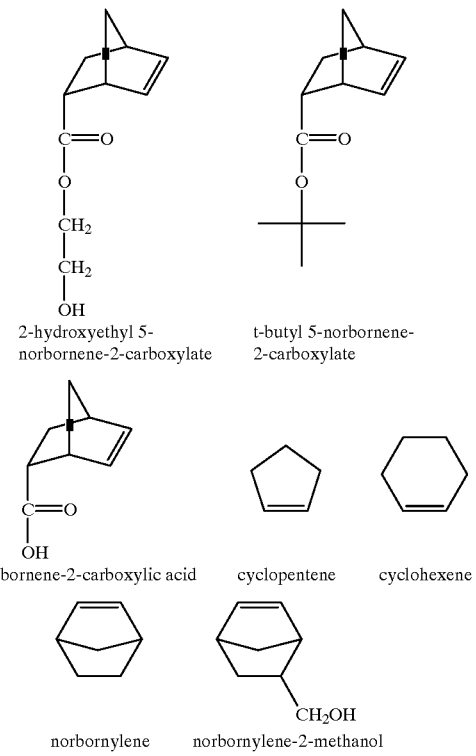

In the present invention, it is generally believed that certain compounds improve selected properties of the novel photoresist resin. In particular, certain effects are achieved by introducing aliphatic cyclo-olefins. For example, compounds such as 2-cyclopentene-1-acetic acid, bicyclo[2,2,2]oct-5-ene-2-carboxylic acid and 5-norbornene-2-carboxylic acid are used as a monomer for improving the sensitivity of photoresist. T-butyl bicyclo[2,2,2]oct-5-ene-2-carboxylate, 2-cyclopentene-1-(t-butyl acetate) and t-butyl 5-norbornene-2-carboxylate can be used as a dissolution inhibitor. 2-hydroxyethyl bicyclo[2,2,2]oct-5-ene-2-carboxylate, 2-hydroxyethyl 5-norbornene-2-carboxylate and norbornylene-2-methanol can be used as an adhesion promotor. Norbornylene, cyclopentene, vinylene carbonate, and cyclohexene can be added in order to alter molecular weight. The influences of the above compounds are merely representative and should not limit the scope of the claims herein. One of ordinary skill in the art would recognize other variations, alternatives, and modifications.

In a specific embodiment, the amine moiety in the photoresist copolymer of the present invention can be selected from N-methylallyl amine, allyl amine, N-allylaniline, N-allylcyclohexyl amine and N-allylcyclopentyl amine, as well as others. As merely examples, structures are shown in the following chemical formulas II:

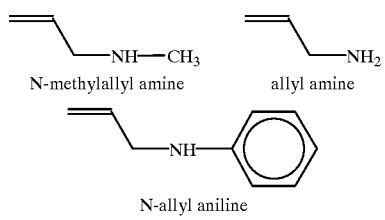

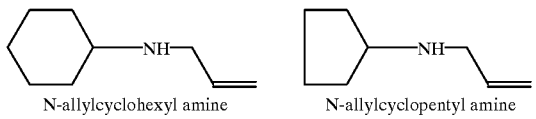

N-allylcyclohexyl amine     N-allylcyclopentyl amine

In accordance with the present invention, the copolymer preferably ranges, in molecular weight, from approximately 3,000 to 200,000. The copolymer can also be at other molecular weights, depending upon the application.

A variety of techniques may be used to yield the novel copolymer of the present invention. For example, at least two aliphatic cyclo-olefins and an amine are polymerized at a high temperature and maintained at a high pressure in the presence of a radical polymerization initiator. The components are subjected to bulk polymerization and solution polymerization.

In an embodiment, the present invention can use a variety of solvents. In an exemplary embodiment, the solvent can be selected from cyclohexanone, methylethylketone, benzene, toluene, dioxane, dimethylformamide, or any mixture thereof. Additionally, the above solvents and/or their mixtures can be employed for the polymerization reaction according to the present invention.

The radical initiator may include a benzoylperoxide, 2,2'-azobisisobutyronitrile ("AIBN") acetylperoxide, laurylperoxide, t-butyl peracetate, t-butyl peroxide, and others. A variety of initiators can also be used. For example, di-t-butyl peroxide can be used as the polymeric initiator, but is not limited to this compound. AIBN or laurylperoxide can be used.

As for the polymerization temperature and pressure, they can be controlled depending on the reactants. For example, temperature can range from 60–200° C., but is not limited to this range. Pressure ranges from about 50–200 atm, but is not limited to this range. Accordingly, temperature and pressure are often selected and controlled depending upon the particular reactants used in the polymerization process.

Depending upon the reactants, the polymerization is carried out for a selected time. For example, the radical polymerization is preferably carried out for 1 to 24 hours, but is not limited to this range of time.

A positive photoresist composition may be obtained by mixing the novel photoresist polymer of the invention with a photoacid generator in an organic solvent in a typical manner. It can be used for the obtainment of the ultrafine positive resist image. Upon formulation, the amount of the copolymer is dependent on organic solvent, photoacid generator and lithography conditions and is preferably about 10–30% by weight of the organic solvent used for the fabrication of the photoresist.

The method for fabricating the photoresist using the copolymer in accordance with the invention illustrates detail with the following description of embodiments. For example, the copolymer of the invention is dissolved in cyclohexanone at an amount of 10–30% by weight and an onium salt or organic sulfonic acid, as a photoacid generator, is added at an amount of about 0.1–10% by weight of the resist polymer. Filtration of the solution with an ultrafine filter yields a photoresist solution.

This photoresist solution is spin-coated on a silicon wafer which is, then, soft-baked at a temperature of 80–150° C. for 1–5 min in an oven or on a hot plate. An exposure process is carried out by use of a stepper which uses deep UV light or an excimer laser as a light source. Thereafter, the wafer is subjected to post-baking at a temperature of 100–200° C. An ultrafine positive resist image can be obtained by immersing the post-baked wafer for 90 seconds in a 2.38% TMAH solution.

Figure 2:
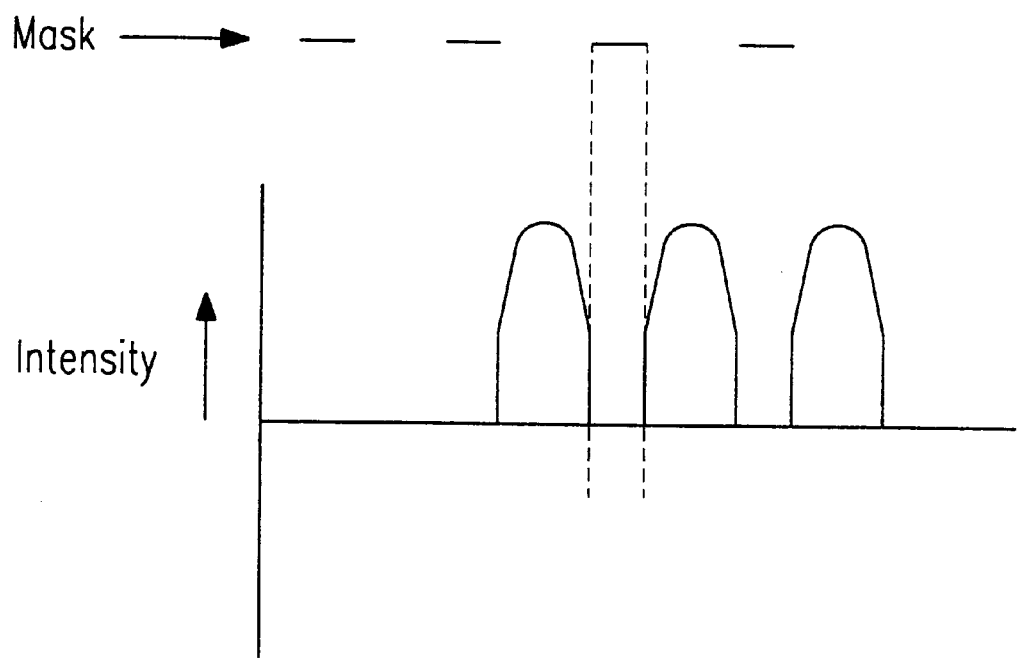
FIG. 2 shows a simplified patterned profile formed by using the novel amine-introduced copolymer according to the present invention.

Since amine groups are linked to the main chain of the novel photoresist copolymer of the invention, they are not diffused by the post-baking. Upon the post-baking, acid diffusion occurs in the photoresist layer under the quartz parr which is irradiated with a great deal of light energy because the acid is much more abundant than the amine in the layer, whereas the acid diffusion is prevented by the amine in the photoresist layer under the chrome part which is irradiated with little light energy. Accordingly, there are formed high resolution images which have the same effect as is shown in FIG. 2. In addition, eventhough amines absorb ArF light, the pattern is not deleteriously affected because their amount is less than the amount of the photoacid generator.

EXAMPLE I

Synthesis of Copolymer (1)

As shown in the following chemical formula III, 2-hydroxyethyl 5-norbonene-2-carboxylate, t-butyl 5-norbonene-2-carboxylate, 5-norbonene-2-carboxylic acid and N-methylallyl amine were charged at a mole ratio of 1:1:1:1 in a high pressure reactor and polymerized in the presence of di-t-butylperoxide under a nitrogen pressure of 50, 60, 70, 80, 90 and 100 atm. Yield was 40% at 80 atm and 60% at 100 atm.

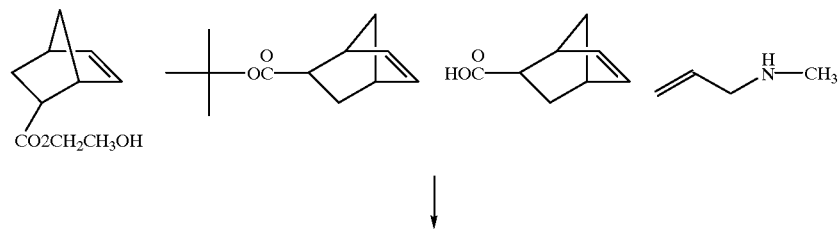

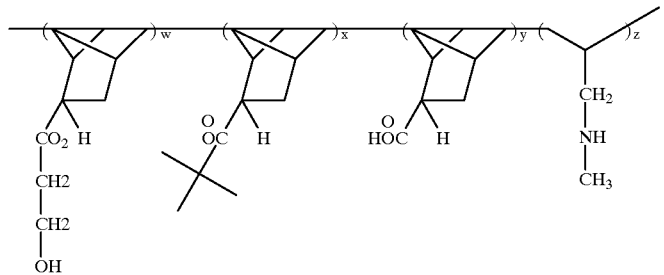

wherein w, x, y and z each represent a polymerization ratio.

EXAMPLE II

Synthesis of Copolymer (2)

As shown in the following chemical formula IV, 2-hydroxyethyl 5-norbonene-2-carboxylate, vinylene carbonate, t-butyl 5-norbonene-2-carboxylate, 5-norbonene-2-carboxylic acid and N-methylallyl amine were charged at a mole ratio of 1:2:1:1:1 in a high pressure reactor and polymerized at a temperature of 60–150° C. for 1–24 hours in the presence of AIBN.

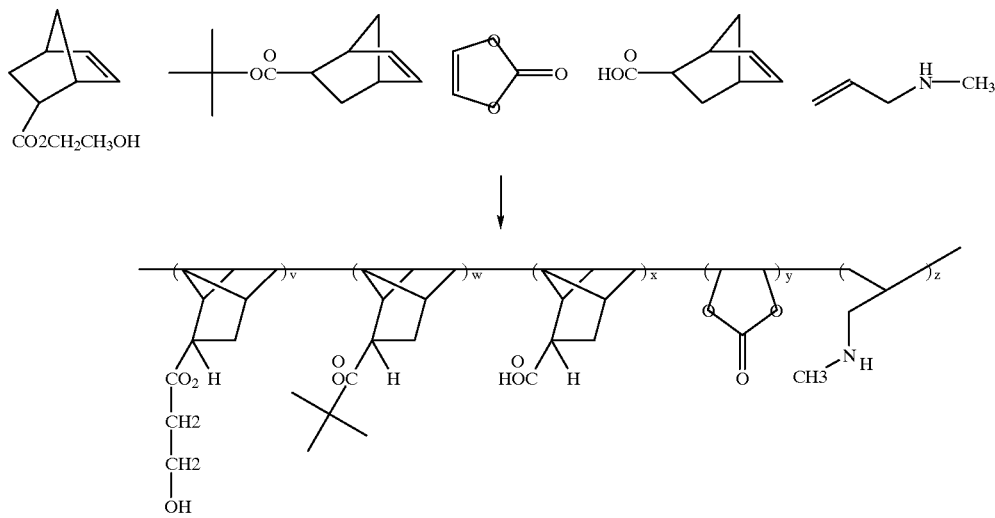

wherein v, w, x, y and z each represent a polymerization ratio.

As described hereinbefore, after being treated with a 2.38 wt % TMAH solution, the photoresist employing the novel copolymer of the invention can be developed into a pattern without a roundish upper part, thereby significantly improving resolution.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise as specifically described.

What is claimed is:

1. A photoresist copolymer, comprising at least two different aliphatic cyclo-olefins and an amine.

2. A photoresist copolymer in accordance with claim 1, wherein said aliphatic cyclo-olefins are selected from the group consisting of vinylene carbonate, 2-cyclopentene-1-acetic acid, 2-cyclopentene-1-(t-butyl acetate), t-butyl bicyclo[2,2,2]oct-5-ene-2-carboxylate, bicyclo[2,2,2]oct-5-ene-2-carboxylic acid, 2-hydroxyethyl bicyclo[2,2,2]oct-5-ene-2-carboxylate, 2-hydroxyethyl 5-norbornene-2-carboxylate, t-butyl 5-norbornene-2-carboxylate, 5-norbornene-2-carboxylic acid, cyclopentene, cyclohexene, norbonylene, and norbonylene-2-methanol.

3. A photoresist copolymer in accordance with claim 1, wherein said amine is selected from the group including N-methylallyl amine, allyl amine, N-allyl aniline, N-allylcyclohexyl amine, and N-allylcyclopentyl amine.

4. A photoresist copolymer in accordance with claim 1, wherein said copolymer ranges, in molecular weight, from approximately 3,000 to 200,000.

5. A method for preparing a photoresist copolymer, comprising polymerization of at least two different aliphatic cyclo-olefins and an amine.

6. A method for preparing a photoresist copolymer in accordance with claim 5, wherein said polymerization of said at least two aliphatic cycle-olefins and said amine is carried out at a temperature of 60–200° C. under a pressure of 50–200 atm.

7. A method for preparing photoresist copolymer in accordance with claim 5, wherein said at least two aliphatic cyclo-olefins are selected from the group including vinylene carbonate, 2-cyclopentene-1-acetic acid, 2-cyclopentene-1-(t-butyl acetate), t-butyl bicyclo[2,2,2]oct-5-ene-2-carboxylate, bicyclo[2,2,2]oct-5-ene-2-carboxylic acid, 2-hydroxyethyl bicyclo[2,2,2]oct-5-ene-2-carboxylate, 2-hydroxyethyl 5-norbornene-2-carboxylate, t-butyl 5-norbornene-2-carboxylate, 5-norbornene-2-carboxylic acid, cyclopentene, cyclohexene, norbonylene, and norbonylene-2-methanol.

8. A method for preparing photoresist copolymer in accordance with claim 5, wherein said amine is selected from the group including N-methylallyl amine, allylamine, N-allylaniline, N-allylcyclohexyl amine, and N-allylcyclopentyl amine.

9. A method for preparing photoresist copolymer in accordance with one of claims 5 to 8, wherein said copolymer ranges, in molecular weight, from approximately 3,000 to 200,000.

10. A photoresist comprising a copolymer of at least two different aliphatic cyclo-olefins and an amine.

11. A photoresist in accordance with claim 10, wherein said at least two aliphatic cyclo-olefins are selected from the group including vinylene carbonate, 2-cyclopentene-1-acetic acid, 2-cyclopentene-1-(t-butyl acetate), t-butyl bicyclo[2,2,2]oct-5-ene-2-carboxylate, bicyclo[2,2,2]oct-5-ene-2-carboxylic acid, 2-hydroxyethyl bicyclo[2,2,2]oct-5-ene-2-carboxylate, 2-hydroxyethyl 5-norbornene-2-carboxylate, t-butyl 5-norbornene-2-carboxylate, 5-norbornene-2-carboxylic acid, cyclopentene, cyclohexene, norbonylene, and norbonylene-2-methanol.

12. A photoresist in accordance with claim 10, wherein said amine is including from the group comprising N-methylallyl amine, allylamine, N-allylaniline, N-allylcyclohexyl amine, and N-allylcyclopentyl amine.

13. A photoresist in accordance to claim 10, wherein said copolymer ranges, in molecular weight, from approximately 3,000 to 200,000.

14. A semiconductor device comprising:

a substrate, and a photoresist film comprising a copolymer of at least two different aliphatic cyclo-olefins and an amine overlying said substrate.

15. A partially completed semiconductor device in accordance with claim 14, wherein said at least two aliphatic cyclo-olefins are selected from the group including vinylene carbonate, 2-cyclopentene-1-acetic acid, 2-cyclopentene-1-(t-butyl acetate), t-butyl bicyclo[2,2,2]oct-5-ene-2-carboxylate, bicyclo[2,2,2]oct-5-ene-2-carboxylic acid, 2-hydroxyethyl bicyclo[2,2,2]oct-5-ene-2-carboxylate, 2-hydroxyethyl 5-norbornene-2-carboxylate, t-butyl 5-norbornene-2-carboxylate, 5-norbornene-2-carboxylic acid, cyclopentene, cyclohexene, norbonylene, and norbonylene-2-methanol.

16. A semiconductor device in accordance with claim 14, wherein said amine is selected from the group including N-methylallyl amine, allylamine, N-allylaniline, N-allylcyclohexyl amine, and N-allylcyclopentyl amine.

17. A partially completed semiconductor device in accordance with one of claims 14 to 16, wherein said copolymer ranges, in molecular weight, from approximately 3,000 to 200,000.

18. A photoresist copolymer in accordance with claim 1, wherein said aliphatic cyclo-olefins are unsubstituted or contain one substituent on the cyclo-olefin ring.

19. A photoresist copolymer in accordance with claim 1, wherein said amine is allyl amine with one or no substituent on its nitrogen atom.

20. A photoresist copolymer consisting essentially of repeating units derived from two different cyclo-olefins and an amine.

* * * * *